(12) United States Patent
Curran

(10) Patent No.: US 6,661,262 B1
(45) Date of Patent: Dec. 9, 2003

(54) FREQUENCY DOUBLING TWO-PHASE CLOCK GENERATION CIRCUIT

(75) Inventor: Brian W. Curran, Saugerties, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/177,323

(22) Filed: Jun. 20, 2002

(51) Int. Cl.[7] .............................................. H03B 19/00
(52) U.S. Cl. ...................................... 327/116; 327/119
(58) Field of Search ................................ 327/116, 119, 327/120, 122, 247, 257, 258, 259, 291, 295; 377/47, 48

(56) References Cited

U.S. PATENT DOCUMENTS

| | | | | |
|---|---|---|---|---|
| 5,359,232 A | * | 10/1994 | Eitrheim et al. ............ | 327/116 |
| 5,365,181 A | * | 11/1994 | Mair ........................... | 327/116 |
| 6,411,139 B1 | * | 6/2002 | Unterricker ................. | 327/122 |

* cited by examiner

*Primary Examiner*—Timothy P. Callahan
*Assistant Examiner*—Linh Nguyen
(74) *Attorney, Agent, or Firm*—Lynn L. Augspurger

(57) ABSTRACT

A clock generation circuit globally distributes a half-frequency clock and doubles the clock frequency locally in a local clock block circuit. The circuit contains several subcircuits which detect the global clock edges (transitions), double the clock frequency and generate two shaped local clocks. A rising edge detection circuit generates a pulse in response to a rising edge of the global clock. A falling edge detection circuit generates a pulse in response to a falling edge of the global clock. A master clock SR (set/reset) latch is reset in response to either pulse and a slave clock SR latch is set in response to either pulse. A delay circuit generates a delayed signal in response to the setting of the master clock SR latch. This delayed signal sets the master clock SR latch and resets the slave clock SR latch. The master clock latch output is repowered to drive the master latches and the slave clock latch output is repowered to drive the slave latches.

9 Claims, 3 Drawing Sheets

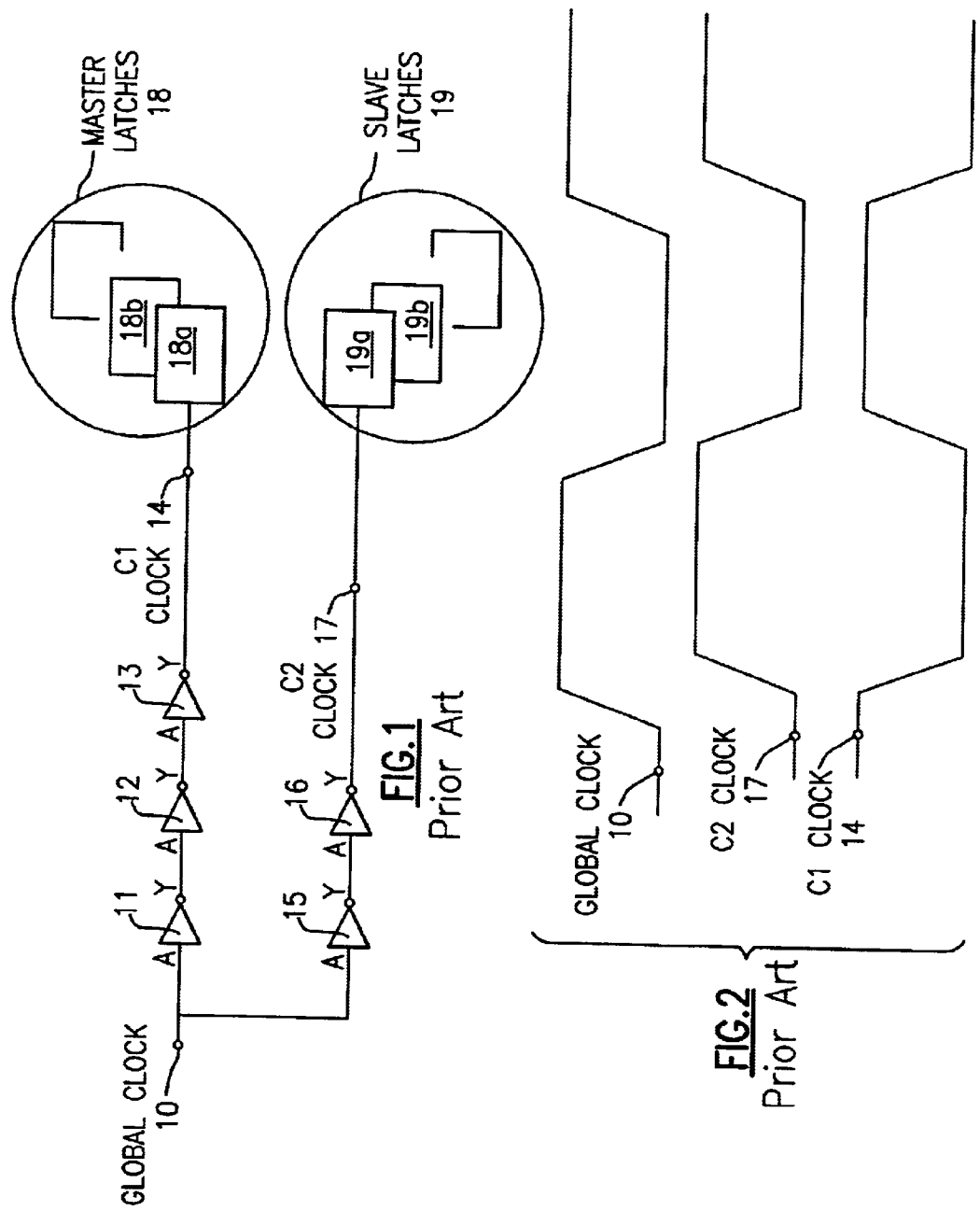

FREQUENCY DOUBLING TWO-PHASE CLOCK GENERATION CIRCUIT

FIELD OF THE INVENTION

This invention relates to chip clock distribution, generation and repowering circuits.

TRADEMARKS

IBM is a registered trademarks of International Business Machines Corporation, Armonk, N.Y., U.S.A. Other names may be registered trademarks or product names of International Business Machines Corporation or other companies.

BACKGROUND

Microprocessor frequencies are scaling with CMOS device speed and are outpacing the capabilities of global chip clock distribution. The problem is two fold. First, the number of circuits per chip is growing roughly as the square of the lithography improvement and thus the clock needs to be distributed to more circuits. Second, the wire performance is relatively constant. The thickest wiring layers which are generally used to route the global clocks behave as a low pass filter with a cutoff frequency which does not improve with device speed. Previously this cutoff frequency limit has been extended through the use of very wide wires. It would be advantageous to extend the global clock distribution frequency limit without reducing the number of wiring tracks available to I/O and signals. It would also be advantageous to reduce the power associated with generating and globally distributing the clock.

SUMMARY OF THE INVENTION

The invention provides a frequency doubling two-phase clock generation circuit which avoids the above described frequency limitation. In accordance with the preferred embodiment of the invention our clock generation circuit globally distributes a half-frequency clock and doubles the clock frequency locally in a local clock block circuit. The preferred circuit contains several subcircuits which detect the global clock edges (transitions), double the clock frequency and generate two shaped local clocks. A rising edge detection circuit generates a pulse in response to a rising edge of the global clock. A falling edge detection circuit generates a pulse in response to a falling edge of the global clock. A master clock SR (set/reset) latch is reset in response to either pulse and a slave clock SR latch is set in response to either pulse. A delay circuit generates a delayed signal in response to the setting of the master clock SR latch. This delayed signal sets the master clock SR latch and resets the slave clock SR latch. The master clock latch output is repowered to drive the master latches and the slave clock latch output is repowered to drive the slave latches.

DESCRIPTION OF THE DRAWING

FIG. 1 illustrates a prior art clock block and master/slave latch.

FIG. 2 illustrates the prior art clock circuit input and output waveforms.

Figure 3:
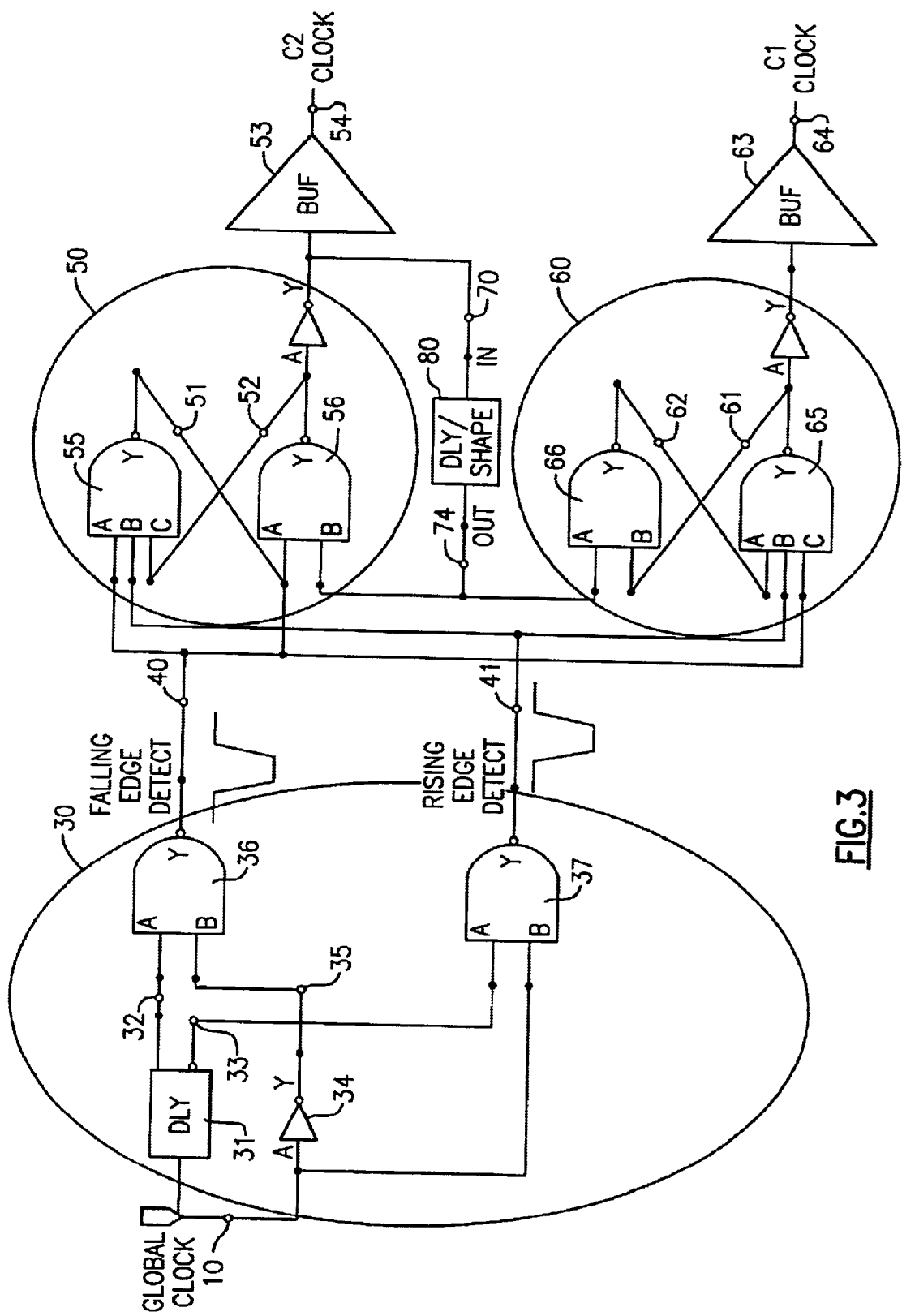
FIG. 3 illustrates the frequency doubling clock circuit in accordance with our preferred embodiment.

Our detailed description explains the preferred embodiments of our invention, together with advantages, and features, by way of example with reference to the drawings.

DETAILED DESCRIPTION OF THE INVENTION

Referring to FIG. 1, the prior-art clock block simply distributes and repowers a global clock to master and slave latches. The global clock 10 is repowered by inverters 11, 12 and 13 to create a local c1 clock 14 which is inverted with respect to the global clock 10. Global clock 10 is also repowered by inverters 15 and 16 to create a local c2 clock 17 which is not inverted with respect to the global clock 10. The local c1 clock 14 is driven through local wires to the local master latches 18. The local c2 clock 17 is driven through local wires to the local slave latches 19.

Referring to FIG. 2, the prior-art clock block outputs two local clocks. The local c1 clock 14 and local c2 clock 17 have different phases than the global clock 10; but these output clocks have the same period (and frequency) as the global clock 10.

Referring to FIG. 3, the preferred embodiment of the invention provides a clock generation circuit having a frequency-doubling clock block which receives a global clock and doubles its frequency to generate two out-of-phase local clocks. The edge detect subcircuit 30 monitors the global clock 10. The edge detect subcircuit 30 consists of a delay circuit 31 which outputs global clock delay in-phase signal 32 and out-of-phase signal 33, an inverter 34 which generates an inverted clock signal 35, a NAND gate 36 which generates a falling edge detection signal 40 and a NAND gate 37 which generates a rising edge detection signal 41. The operation of this edge detect subcircuit 30 is as follows. Initially the global clock 10 is low such that the clock delay in-phase signal 32 is low, the clock delay out-of-phase signal 33 is high, the inverted clock signal 35 is high, the falling edge detection signal 40 is high (inactive) and the rising edge detection signal 41 is high (inactive.) Now a rising transition on the global clock 10 sets both inputs into NAND gate 37 high and causes the rising edge detection signal 41 to drop low (activate.) A fixed amount of delay after global clock 10 rises, the clock delay out-of-phase signal 33 will drop low which causes the rising edge detection signal 41 to return to high (inactivate). Thus, the rising edge detection signal 41 pulses low in response to a rising transition on global clock 10.

Also in response to the rising transition on global clock 10, the clock delay in-phase signal 32 will switch high, and the inverted clock signal 35 will switch low. Now a falling transition on the global clock 10 sets both inputs into NAND gate 36 high and causes the falling edge detection signal 40 to drop low (activate.) A fixed amount of delay after global clock 10 falls, the clock delay in-phase signal 32 will drop low which causes the falling edge detection signal 40 to return to high (inactivate). Thus, the falling edge detection signal 40 pulses low in response to a falling transition on global clock 10.

The falling edge detection signal 40 and rising edge detection signal 41 are driven to slave clock SR (set/reset) latch subcircuit 50 and master clock SR (set/reset) latch subcircuit 60. The master clock SR latch 60 consists of cross-coupled NANDs 65 and 66 and operates as follows. Activation of either falling edge detection signal 40 or rising edge detection signal 41 causes the master clock SR latch internal node 61 to transition high and the master clock SR latch internal node 62 to transition low. This effectively resets the master clock SR latch 60 output which is repowered through buffer 63 to drive the cl clock 64 low (or inactive). The slave clock SR latch 50 consists of cross-coupled NANDs 55 and 56 and operates as follows. Activation of either falling edge detection signal 40 or rising edge detection signal 41 causes the slave clock SR latch internal node 51 to transition high and the slave clock SR latch internal node 52 to transition low. This effectively sets the slave clock SR latch 50 output which is repowered through buffer 53 to drive the c2 clock 54 high (or active).

Figure 4:
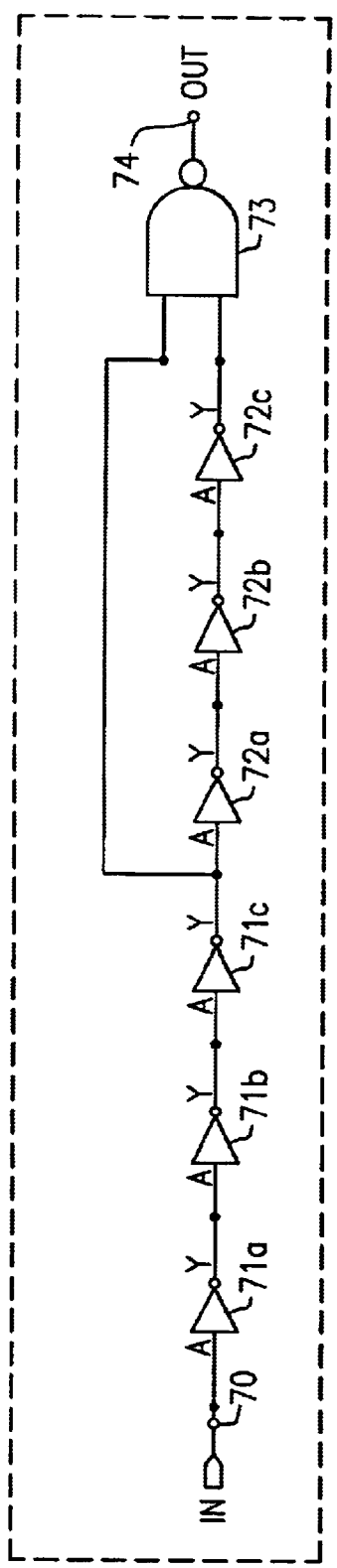
FIG. 4 illustrates the delay/shaping sub-circuit.

The master clock SR latch output node 70 drives a delay/shaping subcircuit 80. Referring to FIG. 4, the operation of the delay/shaping subcircuit 80 is as follows. The delay/shaping input 70 is delayed through two chain of inverters 71 and 72. The output of these inverter chains 71 and 72 are driven to a NAND gate 73 to drive output 74. Initially input 70 is high, the output of inverter chain 71 is low, the output of inverter chain 72 is high and the output 74 is high (inactive). When input 70 switches low the output of inverter chain 72 switches high after three inverter delays. Both inputs to NAND gate 73 are high thus the output 74 is switched low. After three more inverter delays the output of inverter chain 72 is switched low and thus the NAND gate 73 output switches back to high. The delay/shaping circuit 80 thus produces a delayed pulsed low output 74 in response to a falling transition on input 70.

Figure 5:
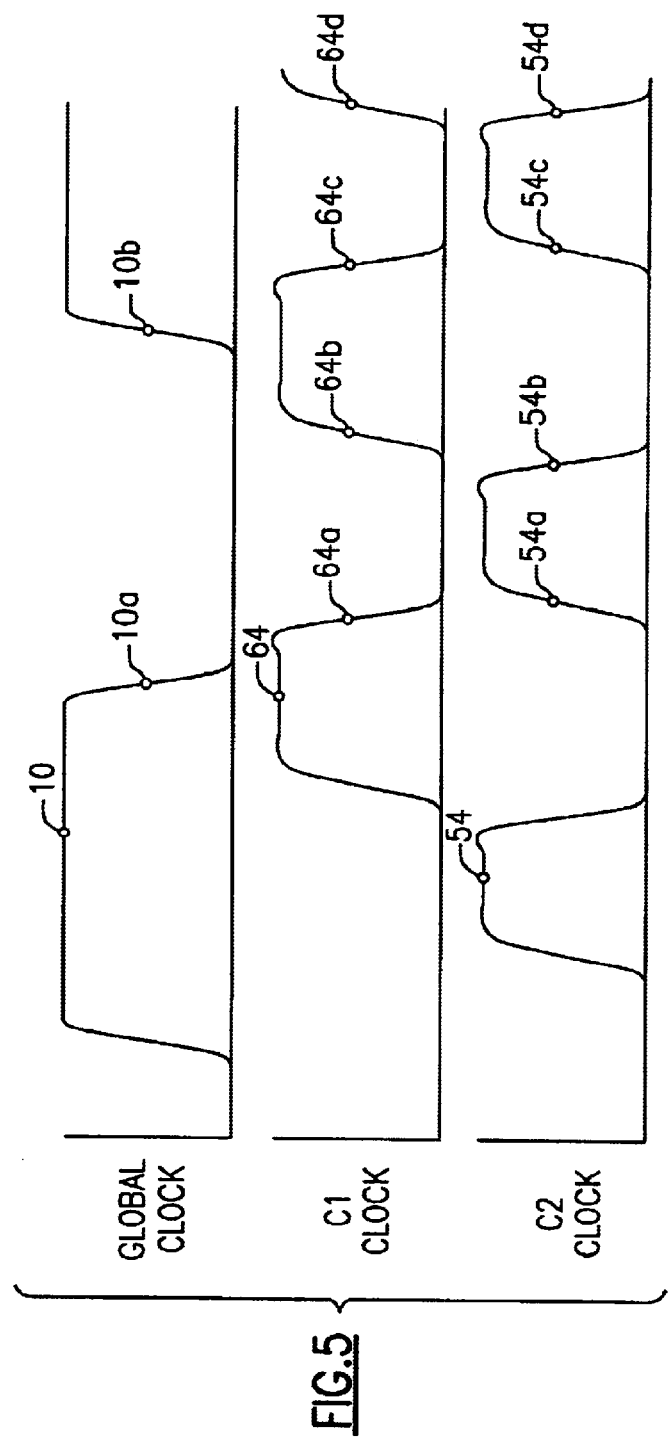
FIG. 5 illustrates the invention clock circuit input and output waveforms.

Referring back to FIG. 3, a falling transition on delay/shaping subcircuit output 74 causes the master clock SR latch internal node 62 to transition high and the master clock SR latch internal node 61 to transition low. This effectively sets the master clock SR latch 60 output which is repowered through buffer 63 to drive the cl clock 64 high (or active). A falling transition on delay/shaping subcircuit output 74 also causes the slave clock SR latch internal node 52 to transition high and the slave clock SR latch internal node 51 to transition low. This effectively resets the slave clock SR latch 50 output which is repowered through buffer 53 to drive the c2 clock 54 low (or inactive). The delay of delay/shaping subcircuit 80 thus determines the cl clock 64 and c2 clock 54 pulse widths. Referring to FIG. 5, the global clock 10 falling transition 10a causes a falling transition 64a on cl clock 64 and a rising transition 54a on c2 clock 54. The delay/shaping circuit 80 causes the rising transition 64b on cl clock 64 and falling transition 54b on c2 clock 54. The global clock 10 falling transition 10b causes a falling transition 64c on cl clock 64 and a rising transition 54c on c2 clock 54. The delay/shaping circuit 80 causes the rising transition 64d on cl clock 64 and falling transition 54d on c2 clock 54. The periods of cl clock 64 and c2 clock 54 are half the period of the global clock 10. Thus the frequency of cl clock 64 and c2 clock 54 is doubled with respect to the frequency of the global clock 10.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A clock generation circuit, comprising,
a frequency doubling two-phase clock generation circuit which receives a global clock and outputs a first clock phase frequency and a second clock phase frequency,
said first clock phase frequency being doubled with respect to said global clock,
said second clock phase frequency being doubled with respect to said global clock,
said clock generation circuit having a plurality of subcircuits including an edge detect circuit which detects transition edges of said global clock, and subcircuits which double a frequency of the global frequency and generate said first clock phase frequency and said second clock phase frequency, wherein said edge detect subcircuit includes a rising edge detection circuit which generates a rising edge pulse in response to a rising edge of the global clock and a falling edge detection circuit which generates a falling edge pulse in response to a falling edge of the global clock.

2. The clock generation circuit according to claim 1, wherein the subcircuits of said clock generation circuit include a master clock SR (set/reset) latch which is reset in response to either a rising edge pulse or falling edge pulse and a slave clock SR latch is set in response to either said rising edge pulse or falling edge pulse.

3. The clock generation circuit according to claim 2, wherein is included a delay circuit which generates a delayed signal in response to the setting of said master clock SR latch which delayed signal sets the master clock SR latch and resets said slave clock SR latch.

4. The clock generation circuit according to claim 3, wherein an output of said master clock SR latch is repowered to drive the master latches and an output of the slave clock SR latch is repowered to drive the slave latches to reduce the power associated with generating and globally distributing the clock.

5. The clock generation circuit according to claim 1, wherein said edge detect subcircuit monitors the global clock and comprises a delay circuit which outputs a global clock's delay in-phase signal and out-of-phase signal, an inverter which generates an inverted clock signal, a falling NAND gate which generates a falling edge detection signal and a rising NAND gate which generates a rising edge detection signal.

6. The clock generation circuit according to claim 5, wherein said falling edge detection signal and rising edge detection signal are driven to the slave clock SR (set/reset) latch subcircuit and the master clock SR (set/reset) latch subcircuit.

7. The clock generation circuit according to claim 6, wherein said master clock SR latch comprises cross-coupled NANDs and wherein activation of either said falling edge detection signal or rising edge detection signal causes the master clock SR latch internal node to transition high and the master clock SR latch internal node to transition low and effectively resets the master clock SR latch output which is repowered to drive a first phase local clock inactive.

8. The clock generation circuit according to claimed 7, wherein said slave clock SR latch comprises of cross-coupled NANDs and wherein activation of either falling edge detection signal or rising edge detection signal causes the slave clock SR latch internal node to transition high and the slave clock SR latch internal node to transition low and effectively sets the slave clock SR latch output which is repowered to drive a second phase local clock active.

9. The clock generation circuit according to claim 7, wherein said edge detect subcircuit monitors the global clock and a falling transition causes a falling transition on a first phase local clock and a rising transition on second phase local clock and a delay/shaping circuit causes the rising transition on said first phase local clock and falling transition on said second phase local clock, and the periods of said local clocks are half the period of the global clock and double the frequency of the global clock.

* * * * *